United States Patent
Senda et al.

(10) Patent No.: US 8,399,341 B2
(45) Date of Patent: Mar. 19, 2013

(54) METHOD FOR HEAT TREATING A SILICON WAFER

(75) Inventors: Takeshi Senda, Niigata (JP); Hiromichi Isogai, Niigata (JP); Eiji Toyoda, Niigata (JP); Kumiko Murayama, Niigata (JP); Koji Araki, Niigata (JP); Tatsuhiko Aoki, Niigata (JP); Haruo Sudo, Niigata (JP); Koji Izunome, Niigata (JP); Susumu Maeda, Hadano (JP); Kazuhiko Kashima, Hadano (JP)

(73) Assignee: Covalent Materials Corporation, Shinagawa-Ku, Tokyo (JP)

( * ) Notice: Subject to any disclaimer, the term of this patent is extended or adjusted under 35 U.S.C. 154(b) by 0 days.

(21) Appl. No.: 13/387,125

(22) PCT Filed: May 17, 2010

(86) PCT No.: PCT/JP2010/003294
§ 371 (c)(1),
(2), (4) Date: Apr. 5, 2012

(87) PCT Pub. No.: WO2011/013280
PCT Pub. Date: Feb. 3, 2011

(65) Prior Publication Data
US 2012/0184091 A1 Jul. 19, 2012

(30) Foreign Application Priority Data
Jul. 27, 2009 (JP) .................. 2009-174024

(51) Int. Cl.
H01L 21/20 (2006.01)
(52) U.S. Cl. .................. 438/509; 438/795; 257/E21.324
(58) Field of Classification Search .................. 438/502, 438/913; 257/E21.317
See application file for complete search history.

(56) References Cited

U.S. PATENT DOCUMENTS

| | | | |
|---|---|---|---|
| 6,129,787 A | 10/2000 | Adachi et al. | |
| 6,492,682 B1 | 12/2002 | Akiyama et al. | |
| 2005/0054124 A1 | 3/2005 | Mun et al. | |
| 2007/0298523 A1 | 12/2007 | Mun et al. | |

FOREIGN PATENT DOCUMENTS

| | | |
|---|---|---|
| JP | 11-260677 A | 9/1999 |
| JP | 2001-144275 A | 5/2001 |
| JP | 2001-151597 A | 6/2001 |
| JP | 2003-115491 A | 4/2003 |
| JP | 2004-193354 A | 7/2004 |
| JP | 2005-086195 A | 3/2005 |

OTHER PUBLICATIONS

International Search Report (PCT/ISA/210) issued on Jun. 8, 2010, by Japanese Patent Office as the International Searching Authority for International Application No. PCT/JP2010/003294.

*Primary Examiner* — Cheung Lee
(74) *Attorney, Agent, or Firm* — Buchanan Ingersoll & Rooney PC

(57) ABSTRACT

The invention is to provide a method for heat treating a silicon wafer reducing grown-in defects while suppressing generation of slip during RTP and improving surface roughness of the wafer. The method performing a first heat treatment while introducing a rare gas, the first heat treatment comprising the steps of rapidly heating the wafer to $T_1$ of 1300° C. or higher and the melting point of silicon or lower, keeping the wafer at $T_1$, rapidly cooling the wafer to $T_2$ of 400-800° C. and keeping the wafer at $T_2$; and performing a second heat treatment while introducing an oxygen gas in an amount of 20-100 vol. %, the second heat treatment comprising the steps of keeping the wafer at $T_2$, rapidly heating the wafer from $T_2$ to $T_3$ of 1250° C. or higher and the melting point of silicon or lower, keeping the wafer at $T_3$ and rapidly cooling the wafer.

8 Claims, 3 Drawing Sheets

METHOD FOR HEAT TREATING A SILICON WAFER

This application claims priority from International Patent Application No. PCT/JP2010/003294, filed on Jul. 27, 2009, the entire contents of which are hereby incorporated by reference.

TECHNICAL FIELD

The present invention relates to a method for heat treating a silicon wafer sliced from a silicon single crystal ingot grown by Czochralski process.

BACKGROUND ART

Recent highly-integrated semiconductor devices require a severer quality of a silicon wafer used as a substrate for such semiconductor devices. In particular, there is a strong demand for the development of a silicon wafer having less grown-in defects in the device active region.

A technique of performing heat treatment on a silicon wafer at high temperature is well known as a process for reducing such grow-in defects.

As one example of such a technique, there is a technique of heat treating a silicon wafer at a temperature range of 1000° C. or higher and 1350° C. or lower for 50 hours or less in a hydrogen and/or inert gas atmosphere, followed by oxidation heat treatment at a temperature range of 800° C. or higher and 1350° C. or lower for 50 hours or less (for example, Patent Document 1).

There is also known a technique of heat treating a silicon single crystal wafer at a temperature of from 1100 to 1300° C. in a non-oxidizing atmosphere for 1 minute or more and heat treating the resulting wafer continuously at a temperature of from 700 to 1300° C. in an oxidizing atmosphere for 1 minute or more without cooling it to a temperature less than 700° C., thereby forming a silicon oxide film on the surface of the wafer (for example, Patent Document 2).

In recent years, a technique for subjecting a silicon wafer to rapid heating/cooling thermal process (RTP: Rapid Thermal Process) is known as a technique of producing, in a high productivity and an easy manner, a silicon wafer with few defects in the surface layer of the wafer.

As one example, there is known a technique of heating a material for substrate obtained from a silicon single crystal having an oxygen concentration of from 11 to $17 \times 10^{17}$ atoms/$cm^3$ (ASTMF121-79) at from 1100 to 1280° C. for from 0 to 600 seconds in an atmosphere containing nitrogen in an amount of 90% or more and then cooling it at a cooling rate of from 100 to 25° C./sec in an atmosphere switched to that containing oxygen in an amount of 10% or more (for example, Patent Document 3).

As another example, there is known a technique in which the temperature in the RTP apparatus is suddenly increased at the predetermined first temperature heating rate to the first temperature (for example, 1120° C.-1180° C.), it is continued at the first temperature for a certain time period. Next, it suddenly decreases at the predetermined first temperature cooling rate to the second temperature (for example, 800° C.), it is continued at the second temperature for a certain time period. Afterwards, it suddenly increases at the predetermined second temperature heating rate to the third temperature (for example, 1200° C.-1230° C.) that is higher than the first temperature, it is continued at the third temperature for a certain time period (for example, Patent Document 4).

CITATION LIST

Patent Document

Patent Document 1: Japanese Patent Application Laid-Open (kokai) No. H11-260677
Patent Document 2: Japanese Patent Application Laid-Open (kokai) No. 2001-144275
Patent Document 3: Japanese Patent Application Laid-Open (kokai) No. 2003-115491
Patent Document 4: Japanese Patent Application Laid-Open (kokai) No. 2005-86195

DISCLOSURE OF THE INVENTION

Problems to be Solved by the Invention

However, the heat treatment technique described in Patent Document 1 and 2 is not preferred because it has poor productivity for long heat treatment time is necessary and in addition, slip tends to occur during heat treatment.

In the heat treatment technique described in Patent Document 3, a nitride film is inevitably formed on the surface of the silicon wafer as a result of heat treatment in an atmosphere containing nitrogen in an amount of 90% or more. Thus, a step of removing the nitride film, such as etching process, is required so that the number of manufacturing steps is increased. Therefore, this technique is not preferred, either.

The heat treatment technique described in Patent Document 4 aims at removing nucleation of the oxide precipitate existing in the neighborhood of surface region of the silicon wafer, acceleration of the nucleation of the oxide precipitate existing in the bulk region of the silicon wafer and the growth; there is a limit for the reduction of the Grown-in defect in the device active area of the silicon wafer.

In view of the above situation, the invention has been made. An object of the invention is to provide a method for heat treating a silicon wafer capable of reducing a grown-in defect while suppressing generation of slip during a rapid heating/cooling thermal process and in addition, capable of improving surface roughness of the silicon wafer obtained by the rapid heating/cooling thermal process.

Means to Solve the Problem

According to an aspect of the invention, there is provided a method for heat treating a silicon wafer comprising the steps of:
producing a silicon single crystal ingot grown by Czochralski process;
slicing the silicon single crystal ingot into plural silicon wafers;
performing a first heat treatment process on the silicon wafer while introducing a first gas including a rare gas, the first heat treatment comprising:
rapidly heating the silicon wafer to a first temperature range of 1300° C. or higher and the melting point of silicon or lower at a first heating rate;
keeping the silicon wafer at the first temperature;
rapidly cooling the silicon wafer to a second temperature range of 400° C. or higher and 800° C. or lower at a first cooling rate; and
performing a second heat treatment process on the silicon wafer while stopping introducing the first gas and instead, introducing a second gas including an oxygen gas in an amount of 20 vol. % or more and 100 vol. % or less; the second heat treatment comprising:

rapidly heating the silicon wafer from the second temperature to a third temperature range of 1250° C. or higher and the melting point of silicon or lower at a second heating rate;

keeping the silicon wafer at the third temperature; and rapidly cooling the silicon wafer from the third temperature at a second cooling rate.

It is preferred that the first temperature is range of 1300° C. or higher and 1380° C. or lower and the third temperature is range of 1250° C. or higher and 1380° C. or lower.

Effect of the Invention

The present invention provides a method for heat treating a silicon wafer capable of reducing a grown-in defect while preventing generation of slip during a rapid heating/cooling thermal process and in addition, capable of improving surface roughness of the silicon wafer obtained by the rapid heating/cooling thermal process.

Accordingly, the heat treated silicon wafer concerning the present invention contributes to the improvement in the yield rate in the device process greatly.

BEST MODE FOR CARRYING OUT THE INVENTION

Figure 1:
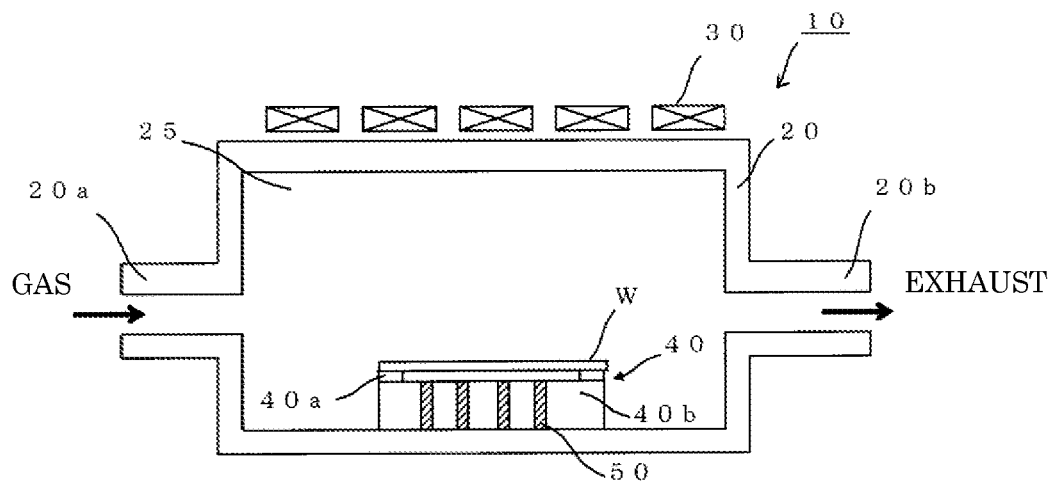
FIG. 1 is a schematic cross-sectional view illustrating an example of an RTP (Rapid Thermal Process) apparatus to be used in the method for heat treating a silicon wafer of the invention.

Exemplary embodiments of the invention will hereinafter be described with reference to the accompanying drawings. FIG. 1 is a schematic cross-sectional view illustrating an example of an RTP (Rapid Thermal Process) apparatus to be used in the method for heat treating a silicon wafer of the invention.

An RTP apparatus 10 to be used in the method for heat treating a silicon wafer of the invention includes, as illustrated in FIG. 1, a reaction tube 20 having an atmospheric gas inlet 20a and an atmospheric gas outlet 20b, a plurality of lamps 30 disposed above the reaction tube 20 separately from one another, and a wafer support 40 for supporting a wafer W in a reaction space 25 in the reaction tube 20. The wafer support 40 has a ring-shaped susceptor 40a for supporting outer circumferential portion of the wafer W and a stage 40b for supporting the susceptor 40a. The reaction tube 20 is made of, for example, quartz. The lamp 30 is constituted by, for example, a halogen lamp. The susceptor 40a is made of, for example, silicon. The stage 40b is made of, for example, quartz.

When the wafer W is subjected to a RTP by using the RTP apparatus 10 illustrated in FIG. 1, the wafer W is put into the reaction space 25 from a wafer inlet (not illustrated) of the reaction tube 20, and placed on the susceptor 40a of the wafer support 40. Then, an atmospheric gas which will be described later is introduced from the atmospheric gas inlet 20a and at the same time, while turning wafer W by the rotating means that is not illustrated, the surface of the wafer W is exposed to the lamp 30.

A temperature control in the reaction space 25 of the RTP apparatus 10 is effected by determining an average of temperatures at multiple points (for example, nine points) in the surface of the wafer in the radial direction of the lower portion of the wafer W by using a plurality of radiation thermometers 50 embedded in the stage 40b of the wafer support 40 and controlling (ON-OFF control of respective lamps or control of emission intensity of light) the plurality of halogen lamps 30 based on the temperature thus determined.

The method for heat treating a silicon wafer according to the invention will hereinafter be described with reference to the accompanying drawings.

The method for heat treating a silicon wafer according to the invention includes subjecting a silicon wafer sliced from a silicon single crystal ingot grown by the Czochralski process to a RTP under particular production conditions.

Growing of the silicon single crystal ingot by the Czochralski process is performed in a known manner.

In other words, the silicon single crystal ingot is produced by heating polycrystalline silicon filled in a quartz crucible into a silicon melt, bringing a seed crystal into contact with the silicon melt from above the liquid surface thereof, pulling up the resulting seed crystal while rotating the crystal and the quartz crucible, and extending it to a predetermined diameter to form a straight cylindrical portion.

The silicon single crystal ingot thus obtained is then processed into a silicon wafer in a known manner.

In other words, the silicon wafer is produced by slicing the silicon single crystal ingot into plural wafers by using an inner diameter blade, a wire saw, etc., and performing various processing steps such as chamfering of peripheral portions of the plural wafers, lapping, etching, and polishing. The processing steps described above are only exemplary and the invention is not limited only to these processing steps.

The silicon wafer thus obtained is then subjected to a RTP under predetermined production conditions.

Figure 2:
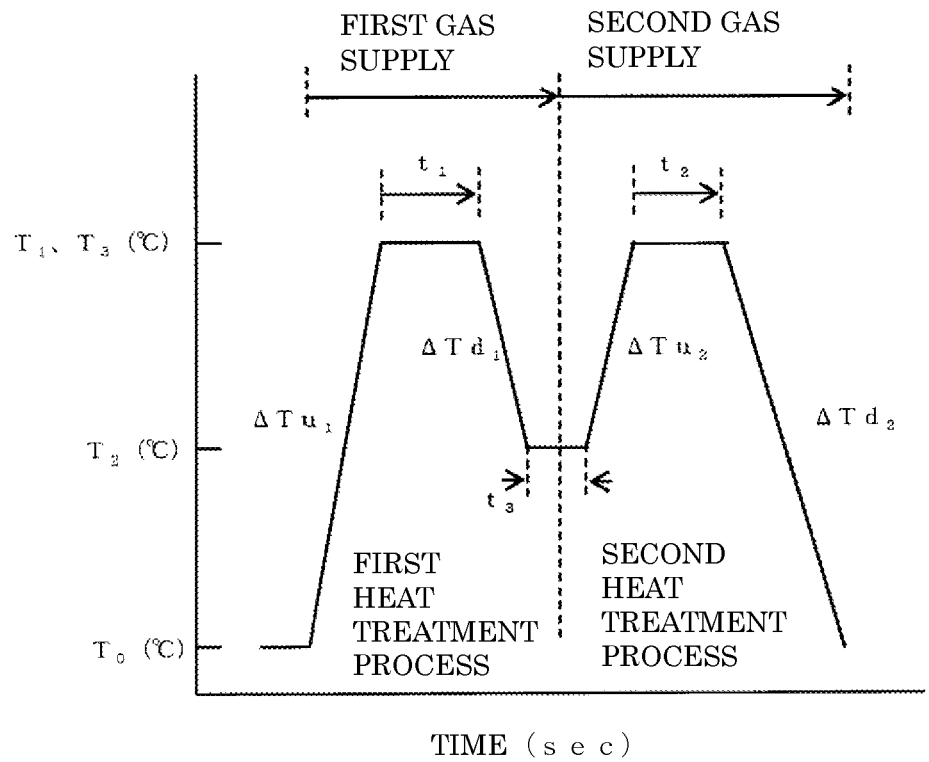
FIG. 2 is a graph for explaining a heat treatment sequence of RTP to be applied to the method for heat treating a silicon wafer according to the invention.

FIG. 2 is a graph for explaining a heat-treatment sequence of RTP to be applied to the method for heat treating a silicon wafer according to the invention.

The RTP to be applied to the method for heat treating the silicon wafer according to the invention has a first and second heat treatment processes.

In the RTP according to the invention, the first heat treatment process is performed while introducing a first gas, and the second heat treatment process is performed while stopping introducing the first gas and instead, introducing a second gas.

In the first heat treatment process, the thus produced silicon wafer is placed in the reaction tube 20 of the RTP apparatus 10 as illustrated in FIG. 1 which is kept at a desired temperature $T_0$ (for example, 500° C.), the silicon wafer is rapidly heated to a first temperature $T_1$ at a first heating rate $\Delta T u_1$, the silicon wafer which is kept at the first temperature $T_1$ for a certain time period $t_1$, the silicon wafer is rapidly cooled at a first cooling rate $\Delta T d_1$ to a second temperature $T_2$, and the silicon wafer which is kept at the second temperature $T_2$.

After performing the first heat treatment process, the second heat treatment process is performed. In the second heat treatment process, the silicon wafer which is kept at the second temperature $T_2$, the silicon wafer is rapidly heated from the second temperature $T_2$ to a third temperature $T_3$ at a second heating rate $\Delta Tu_2$, the silicon wafer which is kept at the third temperature $T_3$ for a predetermined time $t_2$, and the silicon wafer is rapidly cooled from the third temperature $T_3$ at a second cooling rate $\Delta Td_2$. The silicon wafer which is kept at the second temperature $T_2$ for a certain time period $t_3$.

In the first heat treatment process, it is preferable that the first gas includes a rare gas.

If using a nitrogen gas as the first gas, because a nitride film is inevitably formed on the surface of the silicon wafer after the RTP, it is not preferred. Further, if using a hydrogen gas other as the first gas, it is not preferred either because there is a possibility of explosion as a result of mixing with an oxygen gas contained in the second gas at the time of switching the first and second gases which will be described later.

More preferably, the rare gas is a gas (rare gas, 100%) not including any other gas.

For example, if oxygen is included in the rare gas atmosphere, in the first heat treatment process, the oxygen concentration of silicon wafer surface is increased. Therefore, oxygen included in an inner wall oxidation film formed on an inner wall of COP existing in the surface is hard to dissolve in a silicon wafer, it is difficult to improve the grown-in defect reduction capacity of silicon wafer surface.

An Ar gas is preferred as the rare gas.

The first temperature $T_1$ is preferably 1300° C. or higher and the melting point of silicon or lower.

The term "first temperature $T_1$" as used herein means an average of temperatures at multiple points (nine points in the present embodiment) in the surface of the wafer in the radial direction of the lower portion of the wafer W when the wafer W is disposed in the RTP apparatus 10 as illustrated in FIG. 1.

If the first temperature $T_1$ is lower than 1300° C., it is difficult to improve the grown-in defect reduction capacity in the RTP.

It is more preferable that the first temperature $T_1$ is 1300° C. or higher and 1380° C. or lower from the viewpoint of apparatus life.

The second temperature $T_2$ is preferably 400° C. or higher and 800° C. or lower.

The term "second temperature $T_2$" similar to the first temperature $T_1$ as used herein means an average of temperatures at multiple points (nine points in this embodiment) in the surface of the wafer in the radial direction of the lower portion of the wafer W when the wafer W is disposed in the RTP apparatus 10 as illustrated in FIG. 1.

If the second temperature $T_2$ is less than 400° C., productivity may be deteriorated as the RTP. Thus it is not preferred.

If the second temperature $T_2$ exceeds 800° C., the surface roughness of silicon wafer become large. Thus it is not preferred.

The second gas in the second heat treatment process is preferably such that the oxygen containing gas includes an oxygen gas in an amount of 20 vol. % or more and 100 vol. % or less.

The term "includes vol. %" as used herein means, when explaining by referring to FIG. 1, content (vol. %) of the oxygen gas included in the oxygen containing gas supplied into the reaction tube 20.

If the content of the oxygen gas is less than 20 vol. %, it is difficult to improve the grown-in defect reduction capacity in the RTP.

It is preferable for gas except the oxygen included in an oxygen containing gas to be rare gas.

Also, the rare gas can preferably use argon gas.

In a timing to change to the second gas from the first gas, it is preferable that it is performed at the second temperature T2.

In other words, it is not preferred since there is a problem that the surface roughness of the silicon wafer becomes large when a change of the gas is performed at temperature exceeds 800° C.

If change of the gas is performed at 800° C. or less, and it may be performed at the time of cooling in the first heat treatment process or heating in the second heat treatment process.

If change of the gas is at 800° C. or less, when it is performed at the time of heating in the first heat treatment process and at the time of cooling in the second heat treatment process, it is difficult to improve reduction capacity of the Grown-in defect (since the oxygen concentration of silicon wafer surface is increased in the former case, and there is little interstitial silicon (hereinafter referred to as i-Si) introduced in the latter case.

The third temperature $T_3$ is preferably 1250° C. or higher and the melting point of silicon or lower. The term "third temperature $T_3$" similar to the first temperature $T_1$ as used herein means an average of temperatures at multiple points (nine points in this embodiment) in the radial direction of the lower portion of the wafer W when the wafer W is disposed in the RTP apparatus 10 as illustrated in FIG. 1.

If the third temperature $T_3$ is lower than 1250° C., it is difficult to improve the grown-in defect reduction capacity in the RTP.

It is more preferable that the third temperature $T_3$ is 1300° C. or higher and 1380° C. or lower from the viewpoint of apparatus life.

Figure 3:
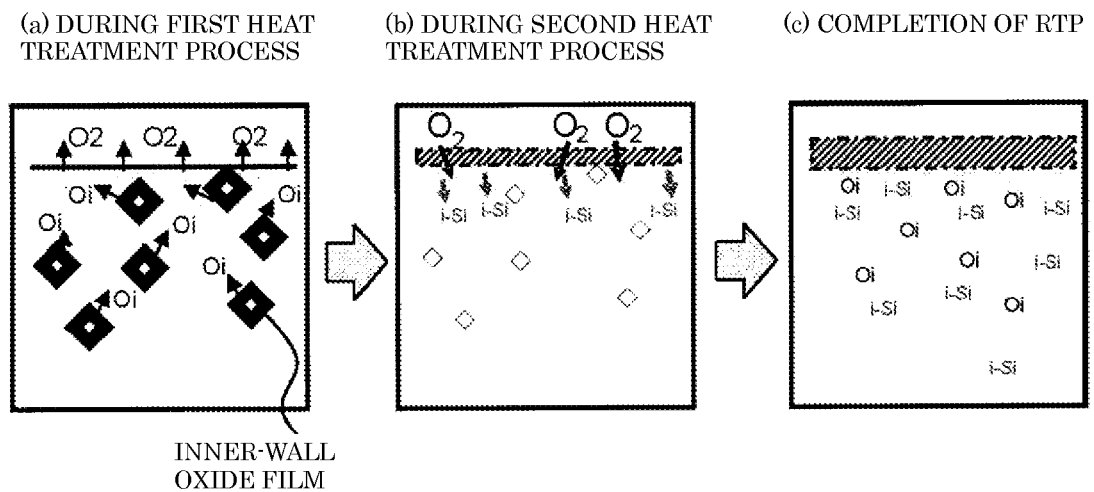
FIG. 3 is a schematic diagram for explaining the mechanism that the LSTD density of the invention is reduced.

Next, an LSTD density reduction mechanism in the invention will be considered with reference to FIGS. 3A to 3C.

When, in the first heat treatment process, the RTP is performed in rare gas, oxygen in the surface of the silicon wafer is diffused outwards and oxygen contained in the inner-wall oxide film of a COP dissolves in the silicon wafer at a high-temperature between 1300° C. and the melting point of silicon (inclusive) (FIG. 3(a)).

In this state, in the second heat treatment process, by switching to the oxygen containing gas containing an oxygen gas in an amount of 20 vol. % or more and 100 vol. % or less, rapid dissolution of oxygen in the silicon wafer occurs and a lot of i-Si is introduced (FIG. 3(b)). The i-Si is filled in the COP which has been deprived of the inner-wall oxide film, whereby the COP disappears and a so-called DZ (Denuded Zone) layer is formed (FIG. 3(c)).

In the DZ layer thus formed, the oxygen solid solution (Oi) remains (FIG. 3(c)). Since a concentration of the oxygen solid solution in the DZ layer is increased, dislocations which have occurred from the backside of the wafer are pinned by the oxygen solid solution, it is possible to suppress extension of the dislocations during the heat treatment (for example, heat treatment in a device forming process) after the RTP.

In addition, the DZ layer having i-Si introduced therein is oversaturated with the interstitial silicon so that the oxygen solid solution can be prevented from re-precipitating in the DZ layer during the heat treatment (for example, heat treatment in the device forming process) after the RTP.

The first heating rate $\Delta Tu_1$ is preferably 10° C./sec or more and 150° C./sec or less.

If the first heating rate $\Delta Tu_1$ is less than 10° C./sec, the productivity may be deteriorated. If the first heating rate $\Delta Tu_1$ exceeds 150° C./sec, slip in the silicon wafer occurs because the silicon wafer cannot withstand a drastic temperature change.

The time $t_1$ for keeping the silicon wafer at the first temperature $T_1$ is preferably 1 sec or longer and 60 sec or shorter, thus realizing the RTP having high productivity.

The first cooling rate $\Delta Td_1$ is preferably 20° C./sec or more and 150° C./sec or less.

If the first cooling rate $\Delta Td_1$ is less than 20° C./sec, it is difficult to improve the grown-in defect reduction capacity in the RTP. If the first cooling rate $\Delta Td_1$ exceeds 150° C./sec, the silicon wafer cannot withstand a drastic temperature change and slip occur therein.

The time $t_3$ for keeping the silicon wafer at the second temperature $T_2$ is preferably 1 sec or longer and 60 sec or shorter, thus realizing the RTP having high productivity.

The second heating rate $\Delta Tu_2$ is preferably 20° C./sec or more and 150° C./sec or less.

If the second heating rate $\Delta Tu_2$ is less than 20° C./sec, it is difficult to improve the grown-in defect reduction capacity in the RTP. If the second heating rate $\Delta Tu_2$ exceeds 150° C./sec, the resulting silicon wafer cannot withstand a drastic temperature change and slip may occur therein.

The time $t_2$ for keeping the silicon wafer at the third temperature $T_3$ is preferably 1 sec or longer and 60 sec or shorter, thus realizing the RTP having high productivity.

The second cooling rate $\Delta Td_2$ is preferably 10° C./sec or more and 150° C./sec or less.

If the second cooling rate $\Delta Td_2$ is less than 10° C./sec, productivity may be deteriorated. When the second cooling rate $\Delta Td_2$ exceeds 150° C./sec, on the other hand, the silicon wafer cannot withstand a drastic temperature change, which lead to generation of slip therein.

EXAMPLES

The advantages of the invention will hereinafter be described specifically by examples. It should however be borne in mind that the invention is not limited to or by the following examples.

[Test 1]

A silicon single crystal ingot having a P type, a crystal plane direction (001), a concentration of oxygen solid solution [Oi] of $1.2 \times 10^{18}$ atoms/cm³ (calculated based on a conversion factor of Old ASTM standards in 1970-1979 Edition), and a resistance of from 23 to 25 Ω/cm was produced by CZ process.

At the time of production, nitrogen doping treatment was performed by putting a silicon wafer coated with a silicon nitride film in a crucible and a pull rate V was adjusted to 1.2 mm/min on average. At the same time, the ingot was pulled up while controlling the pull rate V and a temperature gradient G at 1300° C. in the direction of a crystal axis to control a V/G ratio in order to prevent generation of dislocation clusters during the growth of a silicon single crystal.

The resulting silicon single crystal ingot was then sliced into wafers by a wire saw and subjected to beveling, lapping, etching, and polishing to obtain a double-side polished silicon wafer having a diameter of 300 mm.

Then, the RTP for the silicon wafer thus prepared was performed changing the first temperature $T_1$ and the third temperature $T_3$ respectively, according to the heat treatment sequence as illustrated in FIG. 2 using the RTP apparatus 10 as illustrated in FIG. 1.

The other common conditions as follows.

| | |
|---|---|
| First gas: | argon, 100 vol. %. |
| Second gas: | oxygen, 100 vol. %. |
| $T_0$: | 500° C. |
| $T_2$: | 600° C. |
| $\Delta Tu_1$: | 50° C./sec. |
| $\Delta Td_1$: | 50° C./sec. |

-continued

| | |
|---|---|
| $\Delta Tu_2$: | 25° C./sec. |
| $\Delta Td_2$: | 25° C./sec. |
| $t_1$: | 15 sec. |
| $t_2$: | 15 sec. |
| $t_3$: | 15 sec. |

Next, the LSTD densities of the silicon wafers subjected to the RTP were measured. It was measured using "MO601" (trade name; manufactured by Raytex Corporation) and adjusting the laser wavelength to 680 nm and penetration depth to 5 μm.

Also, the LSTD density of the polished silicon wafer that was not subjected to the RTP was measured, this was assumed to be a reference example.

In addition, a total slip length of the silicon wafer subjected to the RTP was evaluated. The entire wafer was measured using X-ray topography (XRT 300, 004 diffraction) manufactured by Rigaku Corporation. A length of each of a plurality of slips observed across the entire wafer was measured and sum of the lengths of all the slips was evaluated as the total slip length.

Table 1 shows a result of LSTD density in each condition of Test 1.

TABLE 1

| | The first temperature $T_1$ (° C.) | The third temperature $T_3$ (° C.) | LSTD density (unit/cm²) |
|---|---|---|---|
| Comparative Example 1 | 1200 | 1200 | 175.2 |
| Comparative Example 2 | 1200 | 1250 | 123.5 |
| Comparative Example 3 | 1200 | 1300 | 116.7 |
| Comparative Example 4 | 1200 | 1350 | 103.2 |
| Comparative Example 5 | 1250 | 1200 | 145.9 |
| Comparative Example 6 | 1250 | 1250 | 101.5 |
| Comparative Example 7 | 1250 | 1300 | 89.6 |
| Comparative Example 8 | 1250 | 1350 | 72.1 |
| Comparative Example 9 | 1300 | 1200 | 68.6 |
| Example 1 | 1300 | 1250 | 33.7 |
| Example 2 | 1300 | 1300 | 30.5 |
| Example 3 | 1300 | 1350 | 28.9 |
| Comparative Example 10 | 1350 | 1200 | 46.2 |
| Example 4 | 1350 | 1250 | 10.4 |
| Example 5 | 1350 | 1300 | 9.4 |
| Example 6 | 1350 | 1350 | 9.0 |
| Reference Example | — | — | 202.0 |

As shown in table 1, in the case where the first temperature $T_1$ was 1300° C. or higher and the third temperature $T_3$ was 1250° C. or higher, it was confirmed that LSTD density decreased greatly.

Also, about the total slip length, the occurrence of the slip was not confirmed in any conditions, and it was 0 mm.

[Test 2]

In a similar manner to Test 1, a double-side polished silicon wafer having a diameter of 300 mm was produced.

Next, the RTP for the silicon wafer thus prepared was performed changing the oxygen content of the second gas in the range of from 10% to 100% respectively, according to the heat treatment sequence as illustrated in FIG. 2 using the RTP apparatus 10 as illustrated in FIG. 1. The gas except the oxygen of the second gas used argon gas.

The other common conditions as follows.

| | |
|---|---|
| First gas: | argon, 100 vol. %" |
| $T_0$: | 500° C. |

-continued

| | |
|---|---|
| $T_2$: | 600° C. |
| $T_1$, $T_3$: | 1300° C. |
| $\Delta Tu_1$: | 50° C./sec. |
| $\Delta Td_1$: | 50° C./sec. |
| $\Delta Tu_2$: | 25° C./sec. |
| $\Delta Td_2$: | 25° C./sec. |
| $t_1$: | 15 sec. |
| $t_2$: | 15 sec. |
| $t_3$: | 15 sec. |

Next, the LSTD density and the total slip length of the silicon wafers subjected to the RTP were measured, by the method similar to that in Test 1.

Table 2 shows a result of LSTD density in each condition of Test 2.

TABLE 2

| | The oxygen content of the second gas (vol. %) | LSTD density (unit/cm²) |
|---|---|---|
| Comparative Example 11 | 10 | 130.1 |
| Example 7 | 20 | 41.2 |
| Example 8 | 50 | 35.3 |
| Example 9 | 80 | 32.2 |
| Example 10 | 100 | 30.1 |

As shown in table 2, oxygen content of the second gas is 20 vol. % or more and 100 vol. % or less, it was confirmed that LSTD density decreased greatly.

Also, about the total slip length, the occurrence of the slip was not admitted in any conditions, and it was 0 mm.

[Test 3]

In a similar manner to Test 1, a double-side polished silicon wafer having a diameter of 300 mm was produced.

Next, the RTP for the silicon wafer thus prepared was performed changing the second temperature $T_2$ in the range of from 300° C. to 900° C. respectively, according to the heat treatment sequence as illustrated in FIG. 2 using the RTP apparatus 10 as illustrated in FIG. 1.

The other common conditions as follows.

| | |
|---|---|
| First gas: | argon, 100 vol. %. |
| Second gas: | oxygen, 100 vol. %. |
| $T_0$: | 500° C. |
| $T_1$, $T_3$: | 1300° C. |
| $\Delta Tu_1$: | 50° C./sec. |
| $\Delta Td_1$: | 50° C./sec. |
| $\Delta Tu_2$: | 25° C./sec. |
| $\Delta Td_2$: | 25° C./sec. |
| $t_1$: | 15 sec. |
| $t_2$: | 15 sec. |
| $t_3$: | 15 sec. |

Next, the surface roughness of the silicon wafers subjected to the RTP was measured. The surface roughness was measured using AFM (Atomic Force Microscopy) within a measurement range of 3 μm×3 μm.

Also, by the method similar to that in Test 1, the total slip length was estimated.

Figure 4:
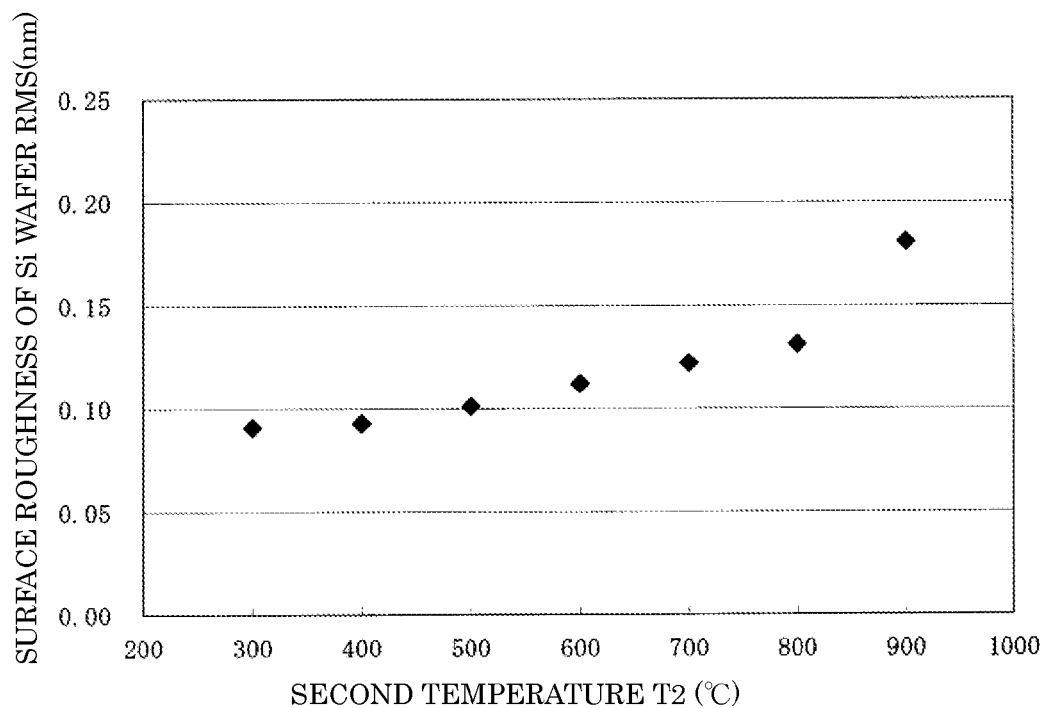
FIG. 4 is a graph illustrating measurement results, under various conditions, of the micro-roughness in Test 3.

FIG. 4 is a graph illustrating measurement results, under various conditions, of the micro-roughness in Test 3.

In FIG. 4, the horizontal axis indicates the second temperature $T_2$(° C.), and the vertical axis indicates the surface roughness RMS (nm).

As shown in table 1, when the second temperature $T_2$(° C.) was equal to or less than 800° C., it was confirmed that surface roughness decreased greatly.

Also, about the total slip length, the occurrence of the slip was not admitted in any conditions, and it was 0 mm.

[Test 4]

In a similar manner to Test 1, a double-side polished silicon wafer having a diameter of 300 mm was produced.

Next, the RTP for the silicon wafer thus prepared was performed by changing a timing of switching to the second gas from the first gas, according to the heat treatment sequence as illustrated in FIG. 2 using the RTP apparatus 10 as illustrated in FIG. 1.

The other common conditions are similar to example 1.

Next, the LSTD density by the method similar to that in Test 1 and the surface roughness by the method similar to that in Test 3 of the silicon wafers subjected to the RTP were measured respectively.

Table 3 shows a result of LSTD density and surface roughness in each condition of Test 4.

TABLE 3

| | Change timing | LSTD density (unit/cm²) | surface roughness RMS (nm) |
|---|---|---|---|
| Example 1 | At the time of the second temperature $T_2$ keeping | 30.2 | 0.11 |
| Comparative Example 14 | At the time of the first temperature $T_1$ keeping | 90.1 | 0.27 |
| Comparative Example 15 | At the time of the third temperature $T_3$ keeping | 45.2 | 0.28 |

As shown in table 3, when the gas switching was performed at the time of keeping the first temperature $T_1$ and third temperature $T_3$, the tendency that the LSTD density was high and the surface roughness turned worse was confirmed.

[Test 5]

In a similar manner to Test 1, a double-side polished silicon wafer having a diameter of 300 mm was produced.

Next, the RTP for the silicon wafer thus prepared was performed by changing the cooling rate $\Delta Td_1$ in the first heat treatment process, using the RTP apparatus 10 as illustrated in FIG. 1. The production conditions in RTP are as follows.

| | |
|---|---|
| First gas: | argon, 100 vol. %. |
| Second gas: | oxygen, 100 vol. %". |
| $T_0$: | 500° C. |
| $T_1$, $T_3$: | 1300° C. |
| $T_2$: | 600° C. |
| $\Delta Tu_1$: | 75° C./sec. |
| $\Delta Td_1$: | 15 conditions in total within a range of from 10 to 170° C./sec. |
| $\Delta Tu_2$: | 25° C./sec. |
| $\Delta Td_2$: | 25° C./sec. |
| $t_1$: | 15 sec. |
| $t_2$: | 15 sec. |
| $t_3$: | 15 sec. |

Next, the total slip lengths of the silicon wafers subjected to the RTP were measured by the method similar to that in Test 1.

Figure 5:
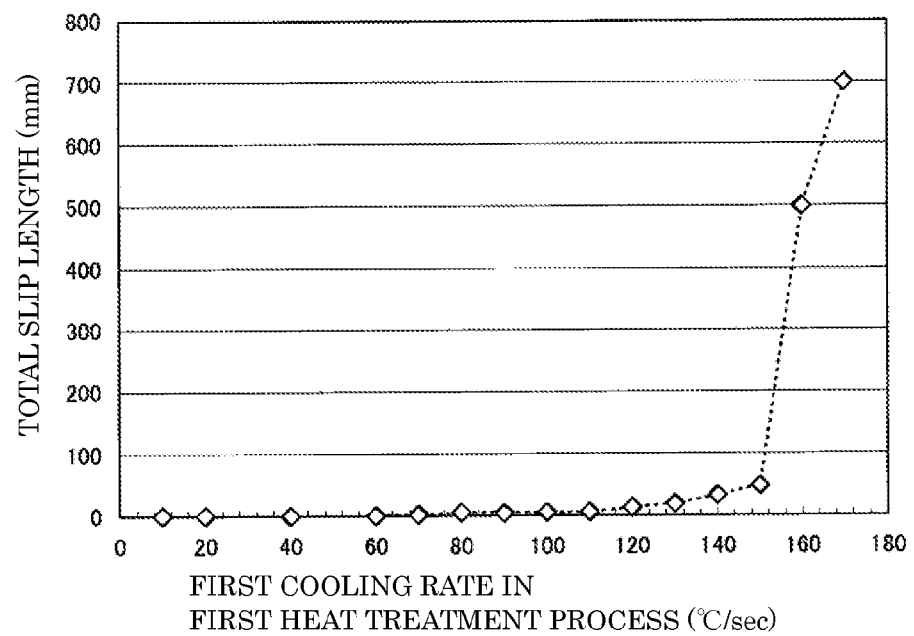
FIG. 5 is a graph illustrating measurement results, under various conditions, of the total slip length of the silicon wafer after the RTP in Test 5.

FIG. 5 is a graph illustrating measurement results, under various conditions, of the total slip length of the silicon wafer after the RTP in Test 5.

It has been confirmed from FIG. 5 that the total slip length shows a drastic increasing tendency when the first cooling rate $\Delta Td_1$ in the first heat treatment process exceeds 150° C./sec.

It has also been confirmed that when the first cooling rate $\Delta Td_1$ is less than 20° C./sec, an LSTD density reduction effect is small. This may be because a low first cooling rate $\Delta Td_1$ causes oxygen in the silicon crystals to gather on the inner wall of the COP again and form an inner-wall oxide film so that the COP does not easily disappear even by the injection of i-Si in the second heat treatment process.

Therefore, it has been confirmed that in the invention, the first cooling rate $\Delta Td_1$ which is highly effective in reducing the LSTD density and prevents generation of slip in the first heat treatment process is preferably 20° C./sec or more and 150° C./sec or less. The upper limit (150° C./sec or less) of the above-described results can also be applied similarly to the second cooling rate $\Delta Td_2$ in the second heat treatment process.

[Test 6]

In a similar manner to Test 1, a double-side polished silicon wafer having a diameter of 300 mm was produced.

Next, using an RTP apparatus 10 as illustrated in FIG. 1, the heating rate $\Delta Tu_2$ in the second heat treatment process was changed, and the silicon wafer thus prepared was subjected to a RTP. Production conditions in the RTP are as follows.

| | |
|---|---|
| First gas: | argon, 100 vol. %. |
| Second gas: | oxygen, 100 vol. %. |
| $T_0$: | 500° C. |
| $T_1, T_3$: | 1300° C. |
| $T_2$: | 600° C. |
| $\Delta Tu_1$: | 75° C./sec. |
| $\Delta Td_1$: | 25° C./sec. |
| $\Delta Tu_2$: | 15 conditions in total within a range of from 10 to 170° C./sec. |
| $\Delta Td_2$: | 25° C./sec. |
| $t_1$: | 15 sec. |
| $t_2$: | 15 sec. |
| $t_3$: | 15 sec. |

Next, the total slip lengths of the silicon wafers subjected to the RTP were measured by the method similar to that in Test 1.

Figure 6:
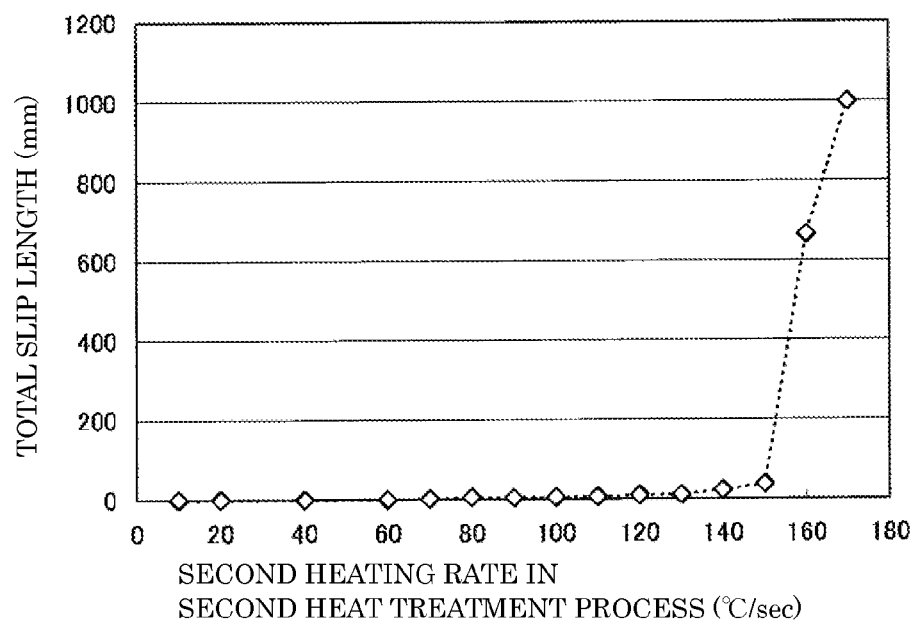
FIG. 6 is a graph illustrating measurement results, under various conditions, of the total slip length of the silicon wafer after the RTP in Test 6.

FIG. 6 is a graph illustrating measurement results, under various conditions, of the total slip length of the silicon wafer after the RTP in Test 6.

It has been confirmed from FIG. 6 that the total slip length shows a drastic increasing tendency when the second heating rate $\Delta Tu_2$ in the second heat treatment process exceeds 150° C./sec.

It has also been confirmed that the LSTD density reduction effect is low when the second heating rate $\Delta Tu_2$ is less than 20° C./sec. This may be because a low second cooling rate $\Delta Tu_2$ causes oxygen in the silicon crystals to gather on the inner wall of the COP again and form an inner-wall oxide film so that the COP cannot easily disappear even by the injection of i-Si in the second heat treatment process.

It can therefore be confirmed that it is preferable in the invention, the second heating rate $\Delta Tu_2$ which is highly effective in reducing the LSTD density and prevents generation of slip in the second heat treatment process is preferably 20° C./sec or more and 150° C./sec or less. The upper limit (150° C./sec or less) of the above-described results can also be applied similarly to the first heating rate $\Delta Tu_1$ in the first heat treatment process.

| Description of Reference Characters | |
|---|---|
| 10 | RTP apparatus |
| 20 | reaction tube |
| 30 | lamp |
| 40 | wafer support |

The invention claimed is:

1. A method for heat treating a silicon wafer comprising the steps of:
   producing a silicon single crystal ingot grown by Czochralski process;
   slicing the silicon single crystal ingot into plural silicon wafers;
   performing a first heat treatment process on the silicon wafer while introducing a first gas including a rare gas, the first heat treatment comprising:
   rapidly heating the silicon wafer to a first temperature range of 1300° C. or higher and the melting point of silicon or lower at a first heating rate;
   keeping the silicon wafer at the first temperature;
   rapidly cooling the silicon wafer to a second temperature range of 400° C. or higher and 800° C. or lower at a first cooling rate; and
   keeping the silicon wafer at the second temperature; and
   performing a second heat treatment process on the silicon wafer while stopping introducing the first gas and instead, introducing a second gas including an oxygen gas in an amount of 20 vol. % or more and 100 vol. % or less; the second heat treatment comprising:
   further keeping the silicon wafer at the second temperature;
   rapidly heating the silicon wafer from the second temperature to a third temperature range of 1250° C. or higher and the melting point of silicon or lower at a second heating rate;
   keeping the silicon wafer at the third temperature; and
   rapidly cooling the silicon wafer from the third temperature at a second cooling rate.

2. The method according to claim 1, wherein the first temperature is range of 1300° C. or higher and 1380° C. or lower and the third temperature is range of 1250° C. or higher and 1380° C. or lower.

3. The method according to claim 2, wherein the first cooling rate is 20° C./sec or more and 150° C./sec or less.

4. The method according to claim 3, wherein the second heating rate is 20° C./sec or more and 150° C./sec or less.

5. The method according to claim 2, wherein the second heating rate is 20° C./sec or more and 150° C./sec or less.

6. The method according to claim 1, wherein the first cooling rate is 20° C./sec or more and 150° C./sec or less.

7. The method according to claim 6, wherein the second heating rate is 20° C./sec or more and 150° C./sec or less.

8. The method according to claim 1, wherein the second heating rate is 20° C./sec or more and 150° C./sec or less.

* * * * *